United States Patent
Fontana

(10) Patent No.: US 9,642,244 B2
(45) Date of Patent: May 2, 2017

(54) MICRO-ELECTRO-MECHANICAL SYSTEMS (MEMS) AND CORRESPONDING MANUFACTURING PROCESS

(71) Applicant: STMicroelectronics S.r.l., Agrate Brianza (IT)

(72) Inventor: Fulvio Vittorio Fontana, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 328 days.

(21) Appl. No.: 13/841,273

(22) Filed: Mar. 15, 2013

(65) Prior Publication Data

US 2013/0276896 A1 Oct. 24, 2013

Related U.S. Application Data

(62) Division of application No. 12/641,108, filed on Dec. 17, 2009, now Pat. No. 9,137,895.

(30) Foreign Application Priority Data

Dec. 24, 2008 (IT) .............................. MI2008A2322

(51) Int. Cl.
*B01L 3/14* (2006.01)
*H05K 1/02* (2006.01)
*B01L 3/00* (2006.01)
*H05K 3/30* (2006.01)
*H05K 1/18* (2006.01)

(52) U.S. Cl.
CPC ...... *H05K 1/0298* (2013.01); *B01L 3/502707* (2013.01); *B01L 3/502715* (2013.01); *H05K 1/0272* (2013.01); *H05K 3/30* (2013.01); *B01L 2200/027* (2013.01); *B01L 2200/12* (2013.01); *B01L 2300/0816* (2013.01); *B01L 2300/0887* (2013.01); *B01L 2300/12* (2013.01); *H05K 1/181* (2013.01); *H05K 2201/10083* (2013.01);
(Continued)

(58) Field of Classification Search
CPC .................................................. B01L 3/502715
USPC ........................................................ 73/53.01
See application file for complete search history.

(56) References Cited

U.S. PATENT DOCUMENTS 6,443,179 B1 9/2002 Benavides et al.
6,499,499 B2 12/2002 Dantsker et al.
(Continued)

FOREIGN PATENT DOCUMENTS

DE 19739722 4/1999
EP 1600753 11/2005

OTHER PUBLICATIONS

Italian Search Report for Application No. ITMI20082322, Ministero dello Sviluppo Economico, Nov. 30, 2009.
(Continued)

*Primary Examiner* — Laura Martin
*Assistant Examiner* — Alex Devito
(74) *Attorney, Agent, or Firm* — Seed IP Law Group LLP

(57) ABSTRACT

An embodiment of a micro-electro-mechanical system of the MEMS type comprising at least one micro-electro-mechanical device of the MEMS type and one junction with a duct suitable to being associated with an external apparatus. Said junction being a printed circuit board PCB comprising at least two layers with juxtaposed faces, a channel being present in at least one face of at least one of said at least two layers suitable for realizing the duct with the juxtaposition of the other face of at least another one of at least two layers.

14 Claims, 7 Drawing Sheets

(52) U.S. Cl.
CPC ...... *Y10T 29/4913* (2015.01); *Y10T 29/49124* (2015.01); *Y10T 137/0318* (2015.04)

(56) References Cited

U.S. PATENT DOCUMENTS

| | | |
|---|---|---|
| 6,989,089 B2 | 1/2006 | Nisch et al. |
| 2002/0043463 A1 | 4/2002 | Shenderov |
| 2004/0104468 A1 | 6/2004 | Suzuki et al. |
| 2004/0159351 A1 | 8/2004 | Znamensky et al. |
| 2004/0265182 A1 | 12/2004 | Chen et al. |
| 2005/0063865 A1 | 3/2005 | Bonne et al. |
| 2005/0140757 A1 | 6/2005 | Silverbrook |
| 2008/0200343 A1 | 8/2008 | Clemens et al. |
| 2010/0154519 A1 | 6/2010 | Fontana |

OTHER PUBLICATIONS

Ansgar Wego, Stefan Richter and Lienhard Pagel : "Fluidic microsystems based on printed circuit board technology", Journal of Micromechanics & Microengineering, Institute of Phisics Publishing, Bristol, GB, vol. 11, No. 5, Sep. 1, 2001, pp. 528-531.
Tobias Merkel, Michael Graeber, Lienhard pagel: "A new tecnology for fluidic microsystems based on PCB technology", Sensors and Actuators A, Elsevier Sequoia S. A., Lausanne, CH, vol. 77, No. 2, Oct. 12, 1999, pp. 98-105.

MICRO-ELECTRO-MECHANICAL SYSTEMS (MEMS) AND CORRESPONDING MANUFACTURING PROCESS

PRIORITY CLAIM

The present application is a Divisional of copending U.S. patent application Ser. No. 12/641,108, filed Dec. 17, 2009, which application claims priority to Italian Patent Application No. MI2008A002322, filed Dec. 24, 2008, and all of foregoing applications are incorporated herein by reference in their entireties.

TECHNICAL FIELD

An embodiment of the present disclosure relates to a micro-electro-mechanical system of the MEMS type which comprises at least one MEMS device and one junction with a duct suitable to being associated with an external apparatus, such as a micro-tank and/or fluidic connection pipes.

An embodiment of disclosure also relates to a process for realizing a Micro-Electro-Mechanical System of the MEMS type.

BACKGROUND

As it is known, MEMS is the acronym of Micro-Electro-Mechanical Systems and identifies a technology for the integration on a same sustrate, in particular a die of silicon, of glass or of organic material, of devices of various nature, mechanical and/or electronic/electric, integrated in a highly miniaturized form.

In particular, the MEMS technology combines the opto-mechanical properties of micro mechanical devices with the electric properties of integrated electronic circuits.

As it can be easily guessed, some realizations such as, for example, pressure sensors, gas analysers, drug micropumps and dispensers for liquids may require a connection to the MEMS devices, and in particular sensitive elements made therein, with external apparatuses, such as tanks, comprising liquids or gases.

Therefore, one may connect the sensitive element of the MEMS device, which has typical sizes of some microns, with an inlet of the external apparatus, whose sizes may be on the order of millimeters.

To this purpose, the use is known, as shown in FIGS. 1-5, as junction, of a cap-like element 6 with a countershaped body suitably coupled to a package 5 of a MEMS device 3. The cap-like element 6 comprises one or more connection conduits 7 projecting from the body for the connection between the sensitive element of the MEMS device 3 and the external apparatus, this latter being nor shown in these figures.

In particular, the external apparatus may be a micro-tank or, for a microfluidic system, fluidic connection pipes.

The conduits 7 of the cap-like element 6 have such external sizes as to be associated with an inlet of the external apparatus, while they have an internal cavity which is adapted to the sizes of the sensitive element of the MEMS device 3, as shown in particular in FIG. 3.

This solution known for the realization of MEMS systems has some drawbacks.

Generally, the package 5, as shown in FIGS. 4 and 5, comprises the MEMS device 3 which is in turn associated with a suitable substrate 2 of polysilicon or of organic or ceramic material. However, before being associated with the substrate 2, the MEMS device 3 is sandwich-wise interposed between two silicon dies assembled by using a glass-based material and by using a particularly difficult and critical process. The process used also employs a material with a lead oxide content of about 80%.

Moreover, as shown in FIG. 5, the wire micro-junctions among the MEMS device 3 and the electronic circuit 4 associated therewith are made by using gold wires having diameter of some tens of microns, with a process which requires an extreme cleanliness of the surfaces whereon the junction is made and an accurate control of the process parameters.

The cap-like element 6, which defines the junction, may require in turn a rather complicated and critical manufacturing process especially for the realization of the ducts 7, which have extremely small sizes. Moreover, during the assembly, the cap-like element 6 may require an additional step specific for the assembly onto the MEMS system 1 and moreover, due to the particularly small sizes, the ducts 7, projecting from the cap body 6 may be easily deformed.

Thus, the MEMS systems with these junctions may be complex and particularly expensive.

SUMMARY

An embodiment of a MEMS system has such structural and functional characteristics as to allow it to overcome the limits and/or drawbacks still limiting MEMS systems realized according to the prior art.

An embodiment of the present disclosure is a MEMS system comprising a junction which incorporates ducts for the connection to an external apparatus.

An embodiment of a MEMS system may be similar to the above described MEMS but wherein said junction is a printed circuit board PCB which comprises at least two layers with juxtaposed faces, a channel being present in at least one juxtaposed face of said two layers suitable for realizing the duct with the juxtaposition of the other face of these at least two layers.

The junction may comprise at least two holes, an input one and an output one, in contact with the duct.

In an embodiment, thanks to the printed circuit board, realized with PCB technology, the ducts and the suitable passing holes, realized in the thickness of the printed circuit board to put in contact respectively the MEMS device and the external apparatus, are realized in a simple and accurate way with sizes and arrangements able to meet any design layout and easily overcoming the size differences of the external apparatus inlet. Moreover, the printed circuit board allows to realize easy and simple electric connections between the MEMS device and the electronic circuit comprised with it in the MEMS device or external connection tracks.

A first layer of said at least two layers may comprise a slot, suitable for realizing said duct with the juxtaposition of said other face and of a face of a further layer.

Suitably, the junction may comprise a first embankment limited to the output hole for the connection of said MEMS device and a second embankment limited to the input hole for the connection to the external element.

A protective envelope may cover at least partially the junction and the MEMS device, to realize a single body.

The junction may have at least on one or on both the upper surfaces, an electric connection track for internal and/or external electric connections to the MEMS device.

Moreover, the junction may have on one or on both the upper surfaces at least a housing pad for connection bumps for the MEMS device.

Suitably, the junction may comprise a layer of composite material chosen among a layer of Flame Retardant 4 (FR4) or of Bismaleimide-Triazine (BT) resin or of liquid crystal polymer (LCP) or of Poly-Ether-EtherKeton (PEEK) polymer, all materials that are resistant to high temperatures and are suitable to being metallized.

An embodiment of a method comprises the following steps:
  providing a printed circuit board PCB, with at least two layers with juxtaposed faces, said printed circuit board being suitable for realizing said junction;
  microworking at least one juxtaposed face of said at least two layers to form a channel;
  juxtaposing said faces of at least two layers for realizing said duct.

Suitably, microworking the junction in order to realize at least two holes, an input one and an output one, in contact with said duct.

The microworking step makes a slot in a first layer of said at least two layers, in order to realize the channel, said duct being made by means of a juxtaposition of a face of a further layer onto said first layer.

The junction may be microworked in order to realize:
  a first embankment limited to the output hole for the connection of the MEMS device;
  a second embankment limited to the input hole for the connection of the external apparatus.

Suitably, a protective envelop is made to cover at least one part of the junction and of the MEMS device for realizing a single body.

Advantageously, the junction is made comprising at least one layer of composite material chosen among a layer of Flame Retardant 4 (FR4) or of Bismaleimide-Triazine (BT) resin or of liquid crystal polymer (LCP) or of Poly-Ether-EtherKeton (PEEK) polymer, all materials that are resistant to high temperatures and can be metallised.

BRIEF DESCRIPTION OF THE DRAWINGS

Characteristics and advantages of the device and of the process according to one or more embodiments of the disclosure will be apparent from the following description given by way of indicative and nonlimiting example with reference to the annexed drawings.

In these drawings.

DETAILED DESCRIPTION

With reference to these figures, 10 globally indicates a MEMS system according to an embodiment of the present disclosure.

Figure 7:
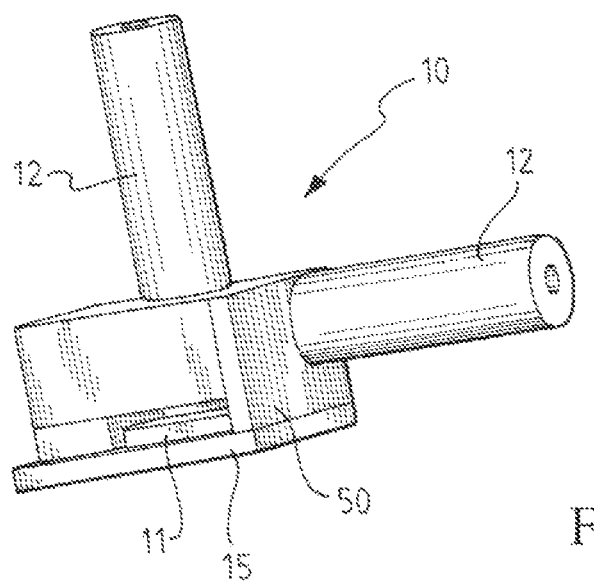
FIG. 7 shows, in a perspective view, the MEMS system of FIG. 6 in a transparent view of the package which makes the internal MEMS device visible.
Figure 8:
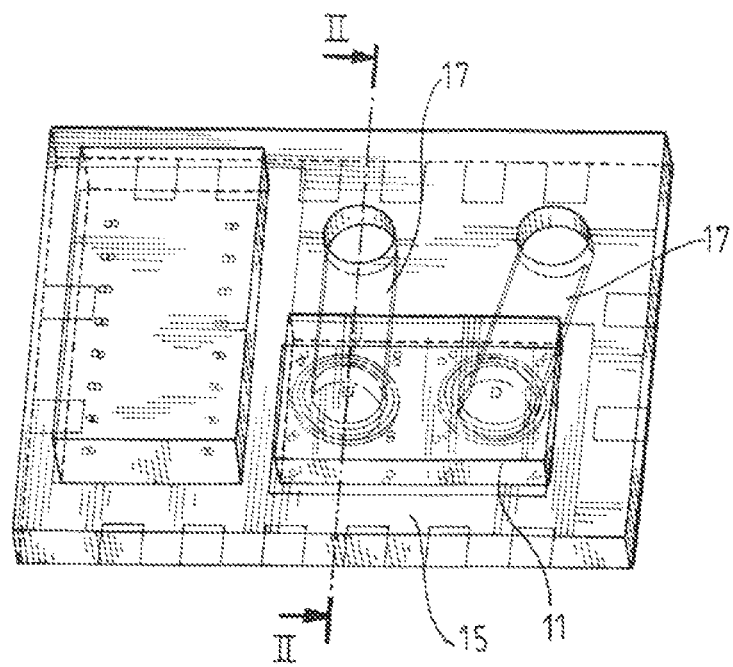
FIG. 8 shows, in a perspective, partially transparent view the junction with associated MEMS devices realized according to an embodiment of the present disclosure.
Figure 9:
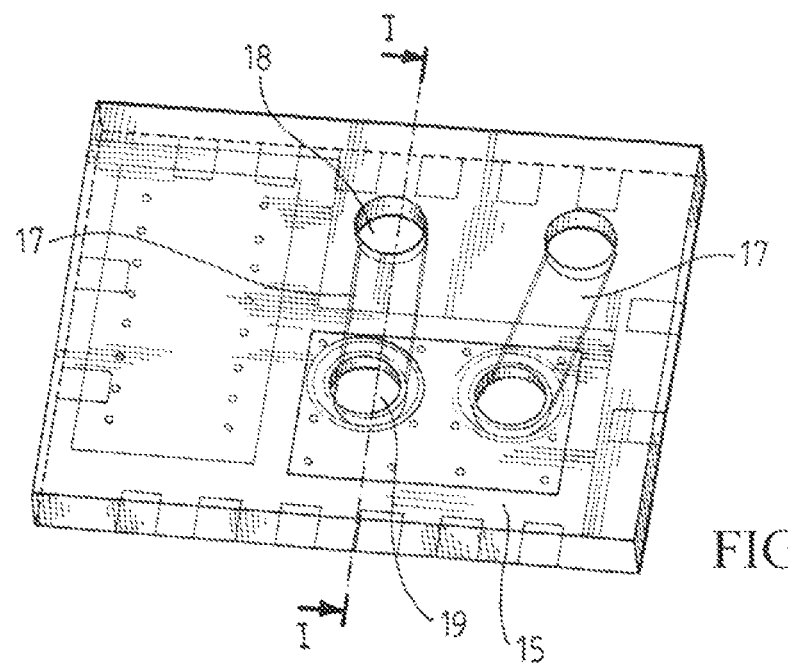
FIG. 9 shows, in a perspective view, the junction of FIG. 8.
Figure 10:
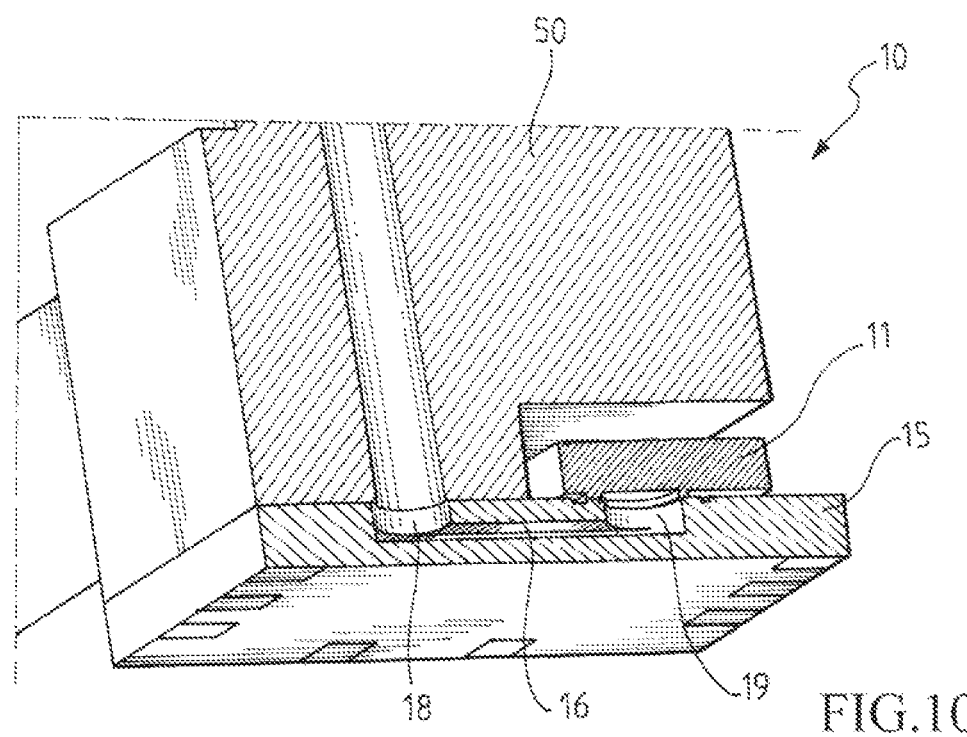
FIG. 10 shows, in a partially section, perspective view in correspondence with a duct, the MEMS system shown in FIG. 7.

As shown in FIG. 7, the MEMS system 10 comprises at least one MEMS device 11 associated with a junction 15 for the connection to an external apparatus 12, such as for example a micro-tank or a fluidic pipe.

Figure 12:
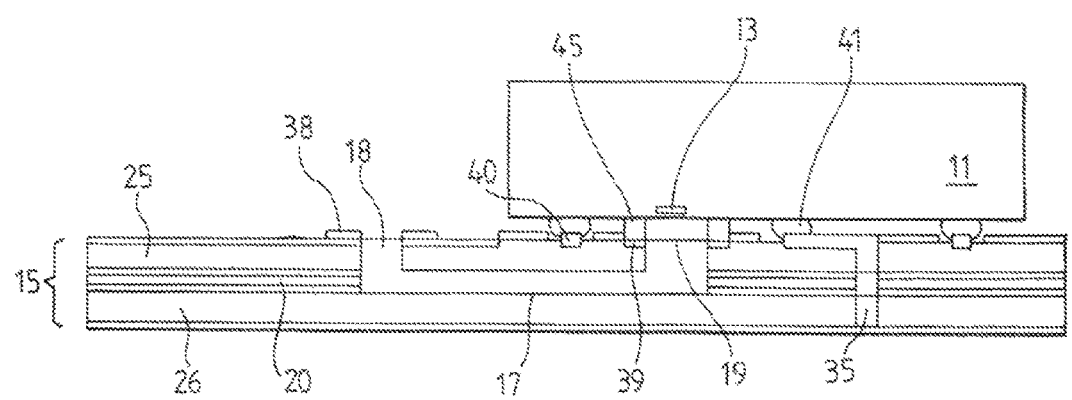
FIG. 12 shows a section view, along line II-II, the junction and the associated MEMS device of FIG. 8.

In particular, as shown in FIG. 12, the MEMS device 11 comprises a sensitive element, for example a detector 13 having a membrane, which is to be put in communication with an inlet of the external apparatus 12 to allow the flow on the detector 13 of a liquid or gaseous solution contained in the external apparatus 12.

Figure 1:
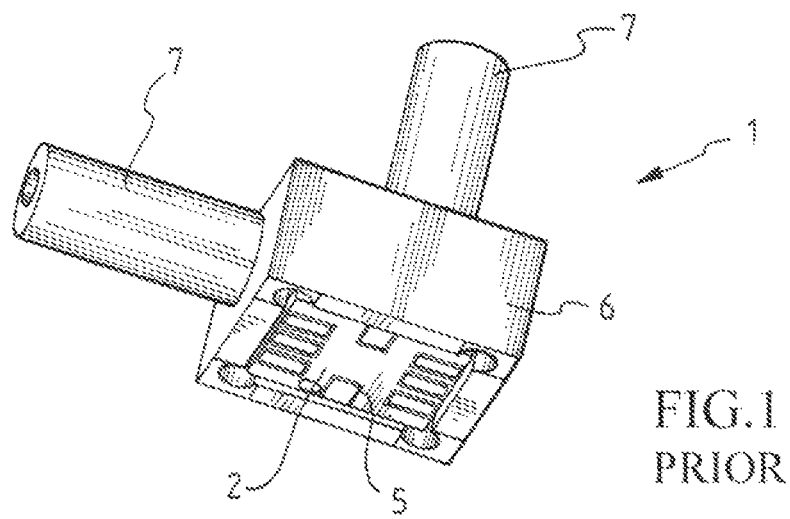
FIGS. 1 and 2 show, in a perspective schematic view, respectively from above and from below, a MEMS device with a junction realized according to the prior art.
Figure 2:
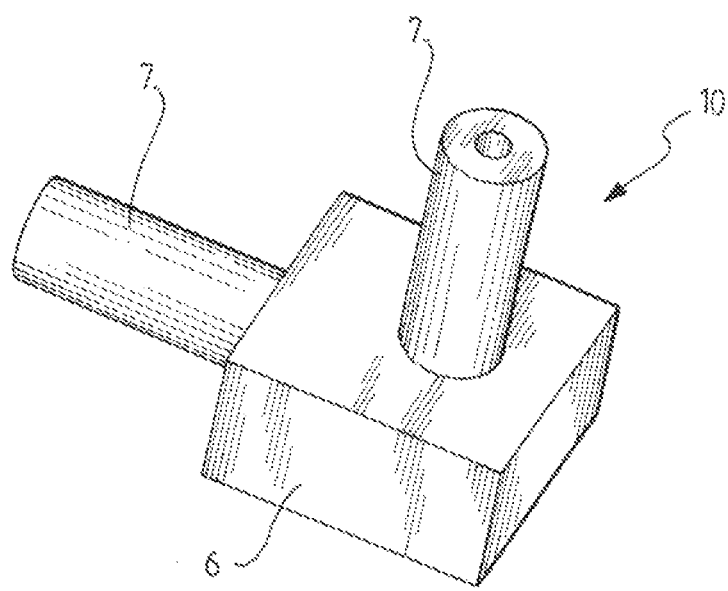
Figure 3:
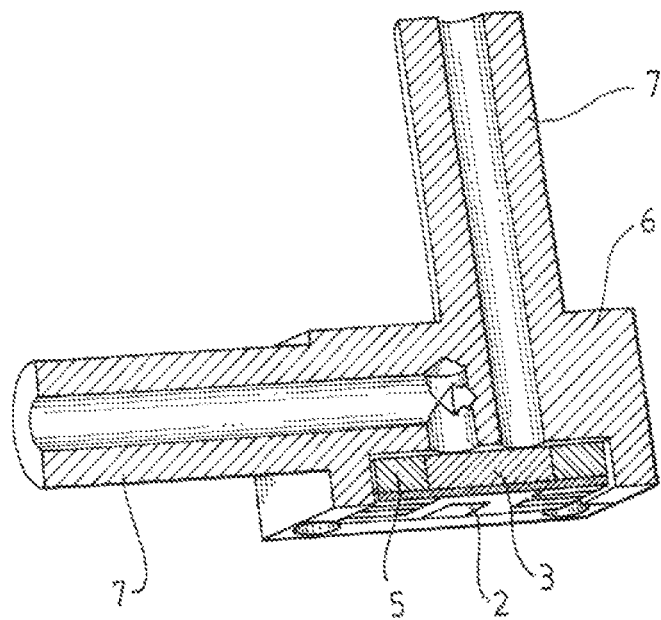
FIG. 3 shows, in a section perspective view, the device of FIG. 1.
Figure 6:
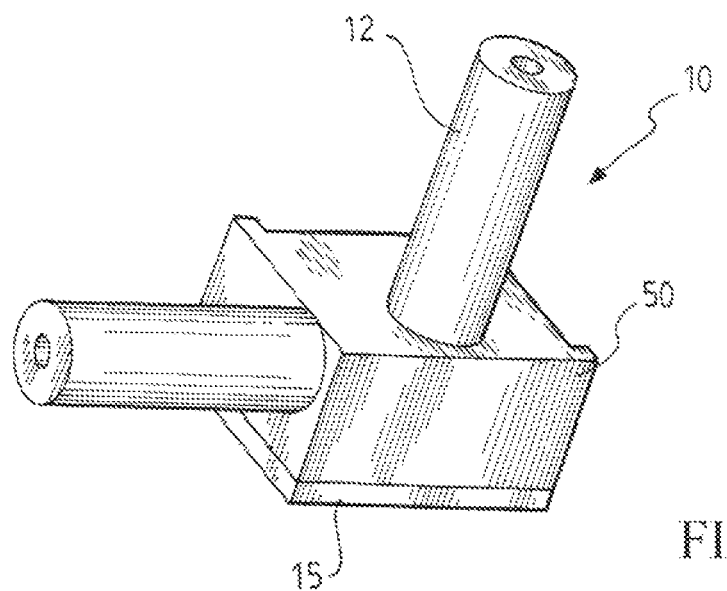
FIG. 6 shows, in a perspective view, a MEMS device associated with a junction realized according to an embodiment of the present disclosure.
Figure 4:
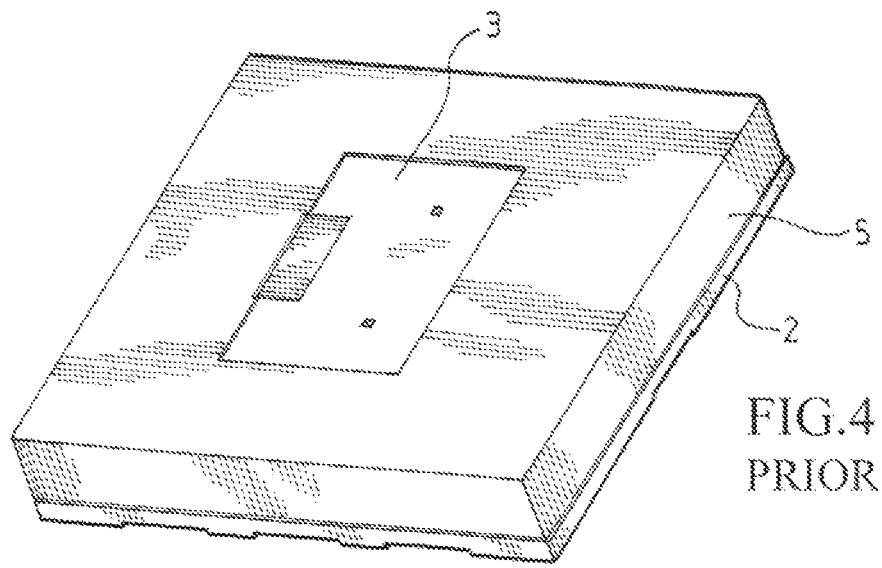
FIGS. 4 and 5 show, in a perspective view, the MEMS device of FIG. 1, respectively with and without the package.
Figure 5:
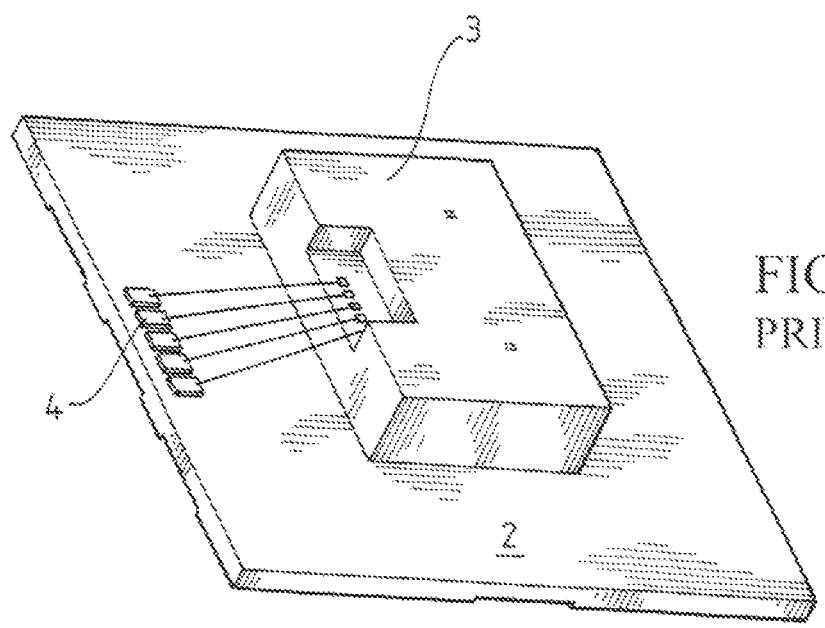

In the embodiment shown in FIGS. 6 and 7, the external apparatuses 12 are two and are respectively associated with a first and with a second detector of the MEMS device 11. Naturally, the number of external apparatuses that could be associated with the junction 15 will depend only on design requirements, as it will become apparent hereafter in the description.

According to an embodiment of the present disclosure, the junction 15 is a printed circuit board or PCB (Printed Circuit Board).

The printed circuit board is substantially a die made as multilayer structure which comprises an overlapping of alternated conductive and insulating layers.

Figure 11:
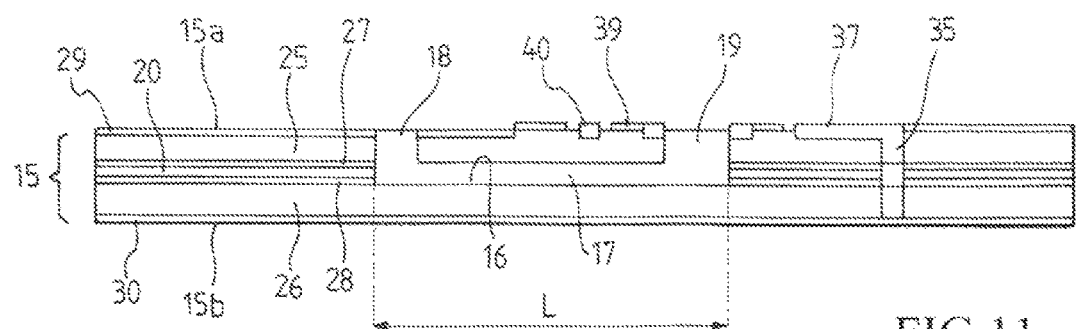
FIG. 11 shows, in a section view, along the line I-I, the junction of FIG. 9.

In particular, according to an embodiment shown in FIG. 11, the printed circuit board comprises three layers 20, 25 and 26, each of composite material and each forming a respective insulating layer, these insulating layers overlapping one another and being arranged in an alternating fashion relative to conductive layers. The printed circuit board has, on the external surfaces, areas arranged for associating electronic devices and has suitable conductive tracks, made in correspondence with the conductive layers, which allow suitable electrical connections to the associated devices.

The junction 15 comprises, for example, in sequence, starting from the bottom, a lower conductive layer 30, generally of copper or other conductive material, that is overlapped by a lower insulating layer 26 of composite material, which is overlapped by a first intermediate conductive layer 28 of material such as copper or other conductive material. Above the first intermediate conductive layer 28 there are an intermediate insulating layer 20 of composite material, a second intermediate conductive layer 27, an upper insulating layer 25 of composite material and, finally, an upper conductive layer 29 of copper of other material.

Generally, the junction 15 has on the upper surface 15a and on the lower surface 15b corresponding coating layers that are made by an insulating paint called "solder resist" or "solder mask" which protects from oxidation and from undesired electric contact the portions respectively of the upper conductive layer 29 and the lower conductive layer 30 not intended for the soldering of the MEMS devices which will be subsequently integrated.

The intermediate insulating layer 20 of composite material is the core of the junction 15 and defines, in particular, its rigidity. The layer 20 and moreover the other insulating layers of the junction 15, as well as the upper insulating layer 25 and the lower insulating layer 26, may be a layer of Flame Retardant 4 (FR4) or of Bismaleimide-Triazine (BT) resin or of liquid crystal polymer (LCP) or CEM-1 type laminate, or of Poly-Ether-EtherKeton (PEEK) polymer, all materials that are resistant to high temperatures and suitable for being metallized.

The alternation of the layers composing the junction 15, as well as their thickness, may be different from those indicated according to design needs.

Suitably, the layers which define the junction 15 may be individually and separately microworked, with the PCB technology by means of precision mechanical microworkings, such as for example numerical control milling, and suitable three-dimensional metallizations.

Further adhesive layers as well as the interposition of insulating layers, for example of pre-peg which is a tissue of resin glass, may be present between the layers of the junction 15.

Moreover, all the above indicated layers of insulating composite material with alternating conductive material layers, as well as possible additional layers, may be attached to each other by interposition of suitable adhesive layers, in a single final pressure assembling step, for realizing the junction 15 as monolithic element.

Suitably, according to an embodiment of the present disclosure shown in FIG. 11, a slot 16 is made in the region of the intermediate insulating layer 20 of composite material. This slot 16 has a length "L".

The first intermediate conductive layer 28 and the second intermediate layer 27 are juxtaposed onto the intermediate layer 20 of composite material on suitable opposite faces to cover at least said slot 16 thus realizing a duct 17.

Moreover, the insulating layers, lower one 26 and upper one 25, are juxtaposed as well as the other layers in a sandwich-like arrangement in order to define the junction 15.

Suitably, the junction 15 may comprise an input hole 18 and an output hole 19 suitably in communication with the duct 17. The input hole 18 and the output hole 19 are arranged respectively in correspondence with the external tank 12 and with the detector 13 of the MEMS device 11 and may have predetermined and corresponding sizes.

In particular, according to specific requirements, the input hole 18 and the output hole 19 may have different sizes with respect to each other, even of one order of magnitude or more.

The junction 15 may also have a plurality of passing holes 35 or vias, made in the junction and made by means of suitable microworkings of numerical control milling.

The holes 35 of said plurality may be suitably metallized to make suitable electric connections to external conductive paths or possible external supplies.

The junction 15 also may have, on the upper surface 15a, where the MEMS device 11 is associated, prearranged electric connections tracks 37 suitable for realizing suitable electric connections inside the MEMS device, alternatively to the conventional microjunctions.

Moreover, the junction 15 may have prearranged pads 40 where connection bumps 41 of soldering alloy are placed and coupledcoupled through recast and predeposited on the surface of the MEMS device in case a connection of the flip-chip type is used, as shown for example in FIG. 12.

Finally, the junction 15 may have, on the upper surface 15a, a first spacer 38 limited to the output hole 19 for associating in a quick way, by means of, for example, soldering possible connection members 45 between the upper surface 15a and the detector 13 of the MEMS device 11. The possible connection members 45 allow suitably spacing the MEMS device from the junction 15, if required by design requirements, allowing, for example, compensation for the space of the connection bumps 41.

Suitably, the upper surface 15a has a second spacer 39 in correspondence with the input hole 18 to allow a quick soldering connection with possible external pipes.

Figure 13:
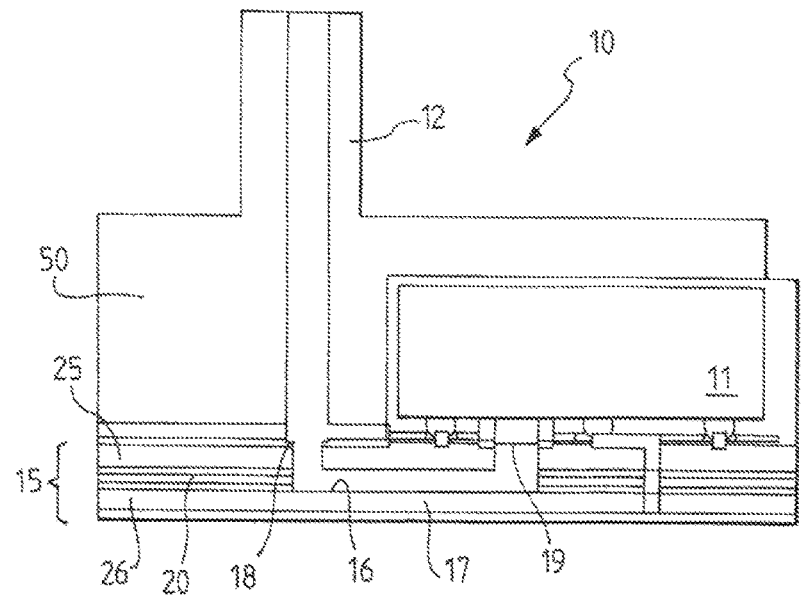
FIG. 13 schematically shows a front section view of the system of FIG. 10.

A protective envelope 50, made of epoxy resin, as shown in FIG. 13, may be made for embedding the junction 15 and the external apparatus 12, micro-tank or pipe associated therewith, to make a single body MEMS system 10.

According to an embodiment of the present disclosure, the duct 17, substantially buried in the junction 15, i.e., in the printed circuit board, allows an excellent communication and a fluidic connection between the external apparatus 12, associated directly or by means of suitable inlets with the input hole 18, and the MEMS device 11, associated with the output hole 19.

The duct 17 may be, according to design requirements, have a linear or multiple-dimensional shape with variable width and length "L" sizes.

In the following description, reference will be made to the previously described MEMS system and details and cooperating parts having the same structure and function will be indicated with the same reference numbers and acronyms.

According to an embodiment of the disclosure, not shown in the figures, the layer 20 of composite material may have a channel 16 on a face suitable for realizing said duct 17 with the juxtaposition of a face of the first or second intermediate conductive layer 28 or 27. In this way, the duct 17 has a lower thickness with respect to the thickness of the layer 20 of composite material.

According to another embodiment of the disclosure, a channel or a slot 16 is made in correspondence with the first intermediate conductive layer 28 or the second one 27, realized by means of copper layers or foils. These channels or slots 16 are, for example, made by means of working with chemical removal of the copper itself. In this case, the duct is obtained with the juxtaposition of a face of the layer 20 of composite material and possibly of other layers according to a sandwich-like arrangement.

According to another embodiment, also not shown in the figures, a first channel or a slot 16 is made in the layer 20 of composite material through a mechanical removal, a second opposite channel is made on a juxtaposed face of the first intermediate conductive layer 28 or second one 27.

Naturally, the duct 17, in the different embodiments, may have a thickness which depends on design specifications and also on the features of the liquid flowing inside. In fact, the embodiments may present:

1. only the intermediate insulating layer 20 that is microworked, and the juxtaposed intermediate conductive layers, the first layer 28 and the second layer 27, that are not microworked. In this case the upper and the lower walls of the duct 17 may be conductive; otherwise one wall may be conductive and the other one may be insulating according to the thickness of the slot 16;

2. the intermediate insulating layer 20 and one of the juxtaposed intermediate conductive layers, the first layer 28 and the second layer 27, are microworked. In this case one wall of the duct 17 is conductive and the other one is insulating;

3. only one of the intermediate conductive layer, the first layer 28 or the second layer 27, is microworked in the multilayer junction 15. In this case both of the duct walls are insulating;

4. the intermediate insulating layer 20 and both juxtaposed intermediate conductive layers, the first layer 28 and the second layer 27, are microworked. Also in this case the walls of the duct 17 are insulating.

According to a further embodiment, the input hole 18 and the output hole 19 may face different surfaces of the junction 15 that are opposite or consecutive. For example, the input hole 18 may face towards the upper surface 15*a* and the output hole 19 towards the lower surface 15*b*.

Several applications may be made by means of the MEMS system according to an embodiment of the present disclosure.

Figure 14:
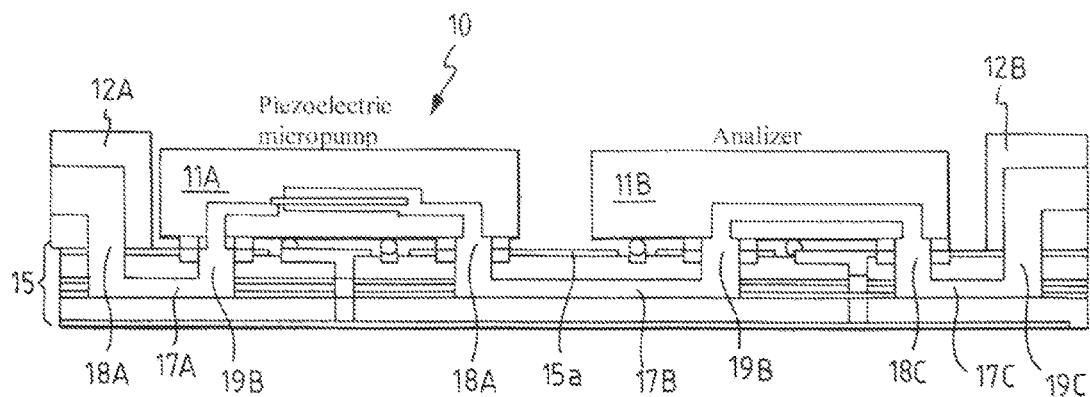
FIG. 14 shows, in a section view, an application realized with a MEMS system according to an embodiment of the present disclosure.

In particular, as shown in FIG. 14, a MEMS system 10 may comprise more MEMS devices 11A, 11B associated with a same junction 15 and coupledcoupled to each other by means of corresponding ducts 17A, 17B, 17C and respective input holes 18A, 18B, 18C and output holes 19A, 19B, 19C.

Even more in particular, a piezoelectric micropump 11A is coupledcoupled by means of a first duct 17A to an input tank 12A and by means of a second duct 17B to a microvalve 11B or fluid or gas analyzer.

Finally, the microvalve 11B is coupledcoupled to an output tank 12B by means of a third duct 17C.

The first, the second, and the third duct 17A, 17B, 17C, according to different embodiments, are all made in the thickness of the layer 20 of composite material or on suitable, prearranged layers composing the junction 15, i.e., the printed circuit board, and may have a predetermined layout according to design requirements.

Figure 15:
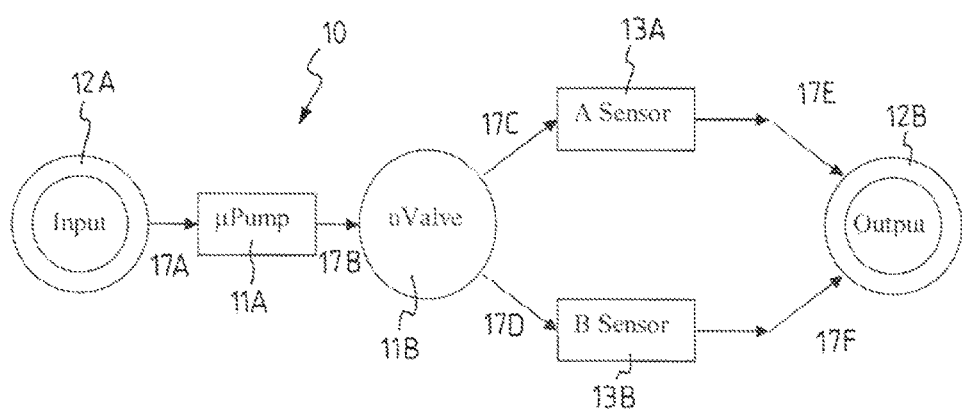
FIG. 15 is a scheme of a MEMS system realized according to an embodiment of the present disclosure.

According to a further embodiment of the disclosure, shown only schematically in FIG. 15, a MEMS system 10 has, with respect to the embodiment previously described in FIG. 14, a microvalve 11B coupledcoupled to a first sensor 13A and to a second sensor 13B both coupledcoupled to an output tank 12B.

Suitably, then, a third duct 17C and a fourth duct 17D connect the microvalve 11B and respectively the first sensor 13A and the second detector 13B to each other.

Finally, a fifth duct 17E and a sixth duct 17F respectively connect the first detector 13A and the second sensor 13B to the output tank 12B.

In particular, then, the ducts connect the micropump 11A and the microvalve 11B "in series" with each other, while the first detector 13A and the second detector 13B are coupledcoupled "in parallel" to each other, thus allowing the monitoring of different characteristics of a fluid or of a gas or to realize a single MEMS system for evaluating fluids different from each other and/or gases different from each other.

The MEMS systems thus made may have reduced dimensions with respect to the known systems, and, in particular, may allow one to make the assembly on a same printed circuit board as MEMS devices as well as other electronic devices with functions different from each other.

Moreover, for realizing MEMS systems according to an embodiment of the present disclosure, it is possible to use standard manufacturing lines for the assembly of MEMS devices, with a remarkable time and cost saving.

Further, the junction, the ducts and the respective input and output holes, obtained according to an embodiment of the present disclosure, may allow one to make an extremely versatile MEMS system with more MEMS devices or more external apparatuses, micro-ranks/pipes arranged in a "series" or "parallel" arrangement.

An embodiment of the present disclosure also relates to a process for realizing a Micro-Electro-Mechanical System of the MEMS type as previously described for which details and cooperating parts having the same structure and function will be indicated with the same reference numbers and acronyms.

As already seen, the MEMS system 10 is of the type comprising a MEMS device 11 and a junction 15 for the connection to an external apparatus 12, such as a micro-tank and/or connection duct, by means of a duct 17.

A process, according to an embodiment of the present disclosure, comprises the step of:
 providing a printed circuit board, Printed Circuit Board PCB suitable for realizing the junction 15, said junction 15 having at least one layer 20 of composite material and a second conductive layer 27 with juxtaposed faces;
 microworking a juxtaposed face of the first layer 20 to make a slot 16;
 juxtaposing the faces of the layer 20 of composite material and of the second layer 27, and further juxtaposing a face of a further conductive layer 28 to said first layer 20 to make the duct 17.

In particular, the junction 15, which may be a printed circuit board, is substantially a die made as multilayer structure which comprises overlapping and alternating conductive and insulating layers, these layers being microworked separately, with PCB technology (Printed Circuit Board), by means for example of precision mechanical microworkings, such as the numerical control milling, and assembled in a single final pressure assembling step.

According to an embodiment shown in FIG. 11, the stack of junction layers 15 provides the overlapping, for example in sequence, starting from the bottom, of a lower conductive layer 30, generally of copper or other conductive material, of a lower insulating layer 26 of composite material, which is overlapped by a first intermediate conductive material layer 28 and by an intermediate insulating layer 20 of composite material for the realization of printed circuit board PCB. Above the intermediate insulating layer 20 of composite material, the stack of layers provides the deposition of a second intermediate conductive layer 27, of an upper insulating layer 25 of composite material and, finally, of an upper conductive layer 29.

The process provides for making on the upper surface 15*a* and on the lower surface 30 coating layer by using an insulating substance called "solder resist" or "solder mask" which allows for protecting, from oxidation and from undesired electric contact, the portions, respectively, of the upper conductive layer 29 and of the lower conductive layer 30 not intended for the soldering of the MEMS device which will subsequently be integrated. In particular, the process comprises a deposition or stretch step of this insulating substance as a coating layer above and below said intermediate insulating layer 20 of composite material.

The process provides for making the intermediate insulating layer 20 as well as the upper insulating layer 25 and the lower insulating layer 26 of composite material by employing a material such as Flame Retardant of the type 4 (FR4) or of Bismaleimide-Triazine (BT) resin or of liquid crystal polymer (LCP) or CM-1 type laminate, or of Poly- Ether-EtherKeton (PEEK) polymer, all materials that are resistant to high temperatures and suitable to being metallized.

The microworking step of an embodiment of the present process makes the slot 16 in the intermediate insulating layer 20 of composite material.

On the junction 15 an input hole 18 and an output hole 19 are then made, in contact with the duct 17, by means of microworkings.

In particular, the process provides for making the input hole 18 in correspondence with the inlet of the external apparatus 12 and the output hole 19 in correspondence with the detector 13 of the MEMS device 11.

The junction 15 may thus be further microworked to make a plurality of passing or via holes 35, which may also be suitably metallized to realize electric connections.

Moreover, on one or on both the external and opposed surfaces, the upper one 15a and the lower one 15b, of the junction 15, prearranged tracks 37 of electric connections may be made to allow electric connections inside the MEMS device 11, alternatively to the conventional wire microjunctions realized in a conventional manner, and also to execute external electric connections with suitable external connection tracks.

By means of microworkings, prearranged pads 40 for housing suitable connection bumps 41 are further made on the upper surface 15a, whereon the MEMS device 11 will be assembled.

Moreover, suitably, the process may make:
a first spacer 39 limited to the output hole 19 to allow a quick coupling, for example through soldering, of a connection spacers 45 between the upper surface 15a of the junction 15 and the detector 13 of the MEMS device 11. These spacers 45 suitably allow compensation of the possible distance between the upper surface 15a and the detector 13 of the MEMS device 11, for meeting design specifications, in particular for the presence of bump connections 41. Alternatively, the spacer 45 may be made by means of deposition through screen printing of a ring of epoxy material.

Moreover, the process may make:
a second spacer 39 in correspondence with the input hole 19 to allow a quick connection, through soldering or gluing, to possible inlets of the external apparatus 12.

The method may then provide an assembling step, which in turn provides the step of:
associating, through soldering or gluing, possible spacers 45 with the first spacer 38 and coupling the MEMS device 11 to these spacers 45, by means for example of a flip-chip mode, by associating the connection bumps 41 of soldering alloy prearranged in suitable pads of the MEMS device 11, and going then on with the junction through reflow of these connection bumps 41 so that the detector 13 is faced onto the output hole 19; and associating the external tank 12 with the input hole 18.

Finally, the process may provide a step of:
realizing, through injection of plastic material or deposition of epoxy resin, a protective envelop 50 of the MEMS device 11 of the junction 15 to make a solid MEMS system.

According to a further embodiment of the present disclosure, the microworking step of the single layers composing the junction 15 provides, in particular, the microworking of the intermediate insulating layer 20 of composite material to realize on a face of this layer 20 a channel 16 suitable for realizing said duct 17 with the juxtaposition of a face of the second juxtaposed intermediate conductive layer 27.

According to an embodiment, the channel 16 and in particular the duct 17 have a depth smaller than the thickness of the intermediate insulating layer 20 of composite material. Moreover, considering the composition of the stack of layers defining the previously described junction 15 shown in FIG. 11, the second juxtaposed intermediate conductive layer 27 is the upper layer but could also be the lower intermediate conductive layer 28, the choice simply being a design specification.

According to a further embodiment, the microworking step makes a first channel in correspondence with a face of the intermediate insulating layer 20 of composite material, another duct in the second juxtaposed intermediate conductive layer 27 and a second channel opposite in correspondence with a second face of the upper insulating layer 25, to make the duct 17 with the juxtaposition of the two faces of the two layers opposite.

The process may make a number of channels 16 and of corresponding ducts 17, with the respective input 18 and output 19 holes, which depends on design requirements and may have a rectilinear or polygonal conformation for connecting more MEMS devices to each other in "series" or in "parallel", as for example shown in FIGS. 14 and 15. Moreover, a process according to further embodiments makes these ducts 17 by microworking same layers of the stack of layers which define the junction 15 or, alternatively, to make this plurality of channels or slots 16 in layers different from each other.

An advantage of the MEMS device according to an embodiment of the present disclosure is its remarkable versatility and adaptability to any device. In fact, an embodiment of the present disclosure allows connection to each other, in a simple and quick way, MEMS devices and external apparatuses having inlets of different sizes also of some orders of magnitude, adapting these inlets with the single input and output holes of the duct made on the junction.

A further advantage of an embodiment of the present disclosure is the precision of the arrangement of the MEMS system obtained. In fact, the microworkings with PCB technology on the junction, allow for making particularly accurate microchannels and holes by means of simple and accurate workings.

Another advantage of a MEMS system according to an embodiment of the present disclosure is the compactness and rapidity of the assembly. In fact, the duct made on the junction allows using an assembling system of the chip-flip type with a remarkable assembly time saving.

Another possible advantage is the safety given by the present junction, in fact the duct is made inside and this allows avoiding possible accidental breakages, with respect to the external pipes of the prior art.

A junction according to an embodiment of the present disclosure allows integrating the channels with the internal electric connections in each MEMS device associated with the junction itself. In fact, suitable connection tracks, metallized holes and vias made directly on the external surfaces of the junction allow for substituting at least in part the wire connections in the MEMS devices and between the MEMS device and the tracks of external connection.

A MEMS system according to an embodiment of the present disclosure allows a remarkable reduction in the time of the assembly cycle. In fact, the connection of the MEMS device on the junction allows for making the mechanical and electric connections at the same time.

Moreover, an embodiment of the present disclosure allows use of, differently from the prior art, MEMS devices associated with the junction devoid of package and caps which are made by means of an epoxy resin. In fact, the printed circuit board which defines the junction uses materials which have a humidity absorption value being much lower than that of an epoxy resin, it is to be remembered that the humidity absorption may cause a variation of the sizes which may result in forces being transmitted to the pressure sensor of the MEMS device contained in the MEMS system, which may render inaccurate the pressure detected by the sensor and thus the precision of the system itself.

In this way, a system according to an embodiment of the present disclosure is thus more accurate and safer with respect to the systems of the prior art and it allows for making more uniform MEMS systems with greater repeatability of technical characteristics and parameters.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated. In particular, one may appreciate that an embodiment of a printed circuit board may be realized with a variable number of layers, and each layer may be a conductive or an insulating one, and also that a single insulating layer of composite material may be sandwiched between other layers.

The invention claimed is:

1. A Micro-Electro-Mechanical System (MEMS), comprising:
   at least one micro-electro-mechanical device of the MEMS type;
   a junction including a duct suitable to provide a fluidic connection between an external apparatus and the micro-electro-mechanical device through the duct;
   wherein said junction comprises a printed circuit board having the micro-electro-mechanical device mounted to the printed circuit board, the printed circuit board including:
      a first layer having first and second conductive surfaces;
      a second layer disposed over the first layer and having a third conductive surface and a fourth opposite conductive surface that faces and is insulated from the first surface;
      a first duct disposed and extending substantially parallel and free from any obstruction, disposed between the first surface of the first layer and the fourth surface of the second layer, the duct having a cavity with a first opening through one of the second and third surfaces and the cavity having a second opening through one of the second and third surfaces, the first opening configured to provide a fluidic connection between the duct and the micro-electro-mechanical device and the second opening configured to receive an external apparatus and to provide a fluidic connection between the external apparatus and the duct to thereby provide a fluidic coupling between the micro-electro-mechanical device and the external apparatus through the duct.

2. The MEMS according to claim 1, wherein said cavity comprises additional openings.

3. The MEMS according to claim 2, wherein the printed circuit board comprises at least two layers with juxtaposed faces, a channel being present in at least one face of said at least two layers suitable for realizing said duct with juxtaposition of the other face of at least two layers, and wherein a first layer of said at least two layers comprises a slot suitable for realizing said duct with the juxtaposition of said other face of a second layer of said at least two layers and of a face of a further layer.

4. The MEMS according to claim 3, wherein said first opening has a size different from said second opening.

5. The MEMS according to claim 4, wherein said junction comprises a first spacer limited to said first opening for the junction of said MEMS device and a second spacer limited to said second opening for the connection to said external apparatus.

6. The MEMS according to claim 5, further comprising a protective envelope which covers at least partially said junction and said MEMS device to make a single body.

7. The MEMS according to claim 6, wherein said printed circuit board comprises said first layer of composite material chosen among a layer of Flame Retardant 4 or of Bismaleimide-Triazine resin or of liquid crystal polymer or of Poly-Ether-EtherKeton polymer.

8. A process, comprising:
   forming on a first layer of a printed circuit board a first conductive surface and a second conductive surface opposite the first conductive surface;
   forming on a second layer of the printed circuit board a third conductive surface and a fourth conductive surface opposite the third conductive surface;
   forming on the second layer a third conductive surface and a fourth conductive surface opposite the third conductive surface, the fourth conductive surface facing and being insulated from the first surface to form a juxtaposed face;
   microworking at least one of the first and fourth conductive surfaces in order to form a channel;
   juxtaposing said first and second layers for realizing a first duct having a structure to receive an external apparatus and to provide fluidic coupling between the external apparatus and a micro-electro-mechanical device of the MEMS type coupled to the printed circuit board, the first duct disposed and extending substantially parallel and free from any obstruction between the first surface of the first layer and the fourth surface of the second layer;
   forming a cavity of the duct;
   forming a first opening of the cavity through one of the second and third surfaces to provide a fluidic connection between the micro-electro-mechanical device and the first duct; and
   forming a second opening of the cavity through one of the second and third surfaces to provide a fluidic connection between the external apparatus the first duct.

9. The process according to claim 8, further comprising microworking said printed circuit board to form additional openings of said cavity.

10. The process according to claim 9, wherein microworking further comprises making a slot in the first layer for realizing said channel;
    and wherein juxtaposing further comprises juxtaposing said second layer and a face of a further layer to said first layer in order to realize said duct.

11. The process according to claim 10 forming the first and second openings further comprises forming the first opening with a size different from a size of the second opening.

12. The process according to claim 11, further comprising microtreating said printed circuit board for realizing a first spacer limited to said second opening for the connection of said micro-electro-mechanical device and a second spacer limited to said first opening for the connection to said external apparatus.

13. The process according to claim 12, further comprising realizing a protective envelope suitable for covering at least a part of said printed circuit board and said micro-electro-mechanical device.

14. The process according to claim 13, further comprising realizing said printed circuit board comprising at least one layer of composite material chosen among a layer of Flame Retardant 4 or of Bismaleimide-Triazine resin or of liquid crystal polymer or of Poly-Ether-EtherKeton polymer.

* * * * *